United States Patent
Laglenne et al.

(10) Patent No.: US 10,666,035 B2
(45) Date of Patent: May 26, 2020

(54) MOUNTING SYSTEM FOR SENSORS ON ELECTRICAL POWER LINES

(71) Applicant: Consolidated Edison Company of New York, Inc., New York, NY (US)

(72) Inventors: John-Paul Laglenne, Ardsley, NY (US); Louis R. Colangelo, New Milford, NJ (US)

(73) Assignee: CONSOLIDATED EDISON COMPANY OF NEW YORK, INC., New York, NY (US)

( * ) Notice: Subject to any disclaimer, the term of this patent is extended or adjusted under 35 U.S.C. 154(b) by 0 days.

(21) Appl. No.: 16/154,251

(22) Filed: Oct. 8, 2018

(65) Prior Publication Data

US 2019/0115739 A1     Apr. 18, 2019

Related U.S. Application Data

(60) Provisional application No. 62/571,580, filed on Oct. 12, 2017.

(51) Int. Cl.
| | |
|---|---|
| *F16M 11/00* | (2006.01) |
| *H02G 7/05* | (2006.01) |
| *H02G 7/12* | (2006.01) |
| *G01R 19/25* | (2006.01) |
| *G01R 15/14* | (2006.01) |
| *H02G 1/02* | (2006.01) |

(52) U.S. Cl.
CPC ........... *H02G 7/053* (2013.01); *G01R 15/142* (2013.01); *G01R 19/2513* (2013.01); *H02G 1/02* (2013.01); *H02G 7/12* (2013.01)

(58) Field of Classification Search
CPC .. G01R 15/14; G01R 15/142; G05B 23/0262; H02K 11/20
See application file for complete search history.

(56) References Cited

U.S. PATENT DOCUMENTS

| | | | |
|---|---|---|---|
| 4,746,241 A | 5/1988 | Burbank, III | |
| 4,758,962 A | 7/1988 | Fernandes | |
| 4,794,328 A | 12/1988 | Fernandes et al. | |
| 4,810,937 A | 3/1989 | Havel | |
| 4,823,022 A * | 4/1989 | Lindsey | G01R 15/14 174/139 |
| 4,904,996 A | 2/1990 | Fernandes | |
| 9,000,875 B2 * | 4/2015 | McBee | H01F 27/06 336/174 |
| 9,368,275 B2 * | 6/2016 | McBee | H01F 27/06 |
| 2016/0204829 A1 * | 7/2016 | Cenizal | H02J 13/00 375/224 |
| 2018/0143234 A1 * | 5/2018 | Saxby | G01R 31/021 |

* cited by examiner

*Primary Examiner* — Amy J. Sterling
(74) *Attorney, Agent, or Firm* — Cantor Colburn LLP

(57) ABSTRACT

A system for mounting a sensor to a power line is provided. The sensor configured to simultaneously measure voltage and current. The system includes a first hot line clamp configured to couple with the power line. A first spacer member is provided having a length and is coupled to the first hot line clamp. A plate is coupled to the sensor and the first spacer member. A current clamp is coupled to the plate and operably coupled between the sensor and the power line. Wherein the first hot line clamp, the first spacer member, the plate and the sensor cooperate in operation to measure the line to ground voltage of the power line. Wherein the current clamp and the sensor cooperate in operation to measure the current of the power line.

10 Claims, 3 Drawing Sheets

MOUNTING SYSTEM FOR SENSORS ON ELECTRICAL POWER LINES

CROSS REFERENCE TO RELATED APPLICATIONS

This application claims the benefit of U.S. Provisional Application Ser. No. 62/571,580, filed Oct. 12, 2017, the entire disclosure of which is incorporated herein by reference.

BACKGROUND

The subject matter disclosed herein relates to a system and method of measuring and monitoring current and voltage in electrical power lines, and in particular to a mounting system and method for mounting a sensor to a powerline to allow measurement of current and voltage from a power source.

Typically electrical characteristics of power lines are measured by individual sensors. As a result, characteristics such as voltage and current are not measured simultaneously. Some sensors allow for the simultaneous measurement of voltage and current with a single sensor, however, these sensors are typically mounted directly adjacent the power line. Since the power line is live and cannot be deactivated, it is difficult for utility personnel to install and remove the sensors.

Accordingly, while existing monitoring systems are suitable for their intended purposes the need for improvement remains, particularly in providing a mounting system that allows utility personnel to couple and uncouple a sensor from the electrical power line and allowing measurement of current and voltage from a power source.

BRIEF DESCRIPTION

According to one aspect of the disclosure a system for mounting a sensor to a power line is provided. The sensor configured to simultaneously measure voltage and current. The system includes a first hot line clamp configured to couple with the power line. A first spacer member is provided having a length and is coupled to the first hot line clamp. A plate is coupled to the sensor and the first spacer member. A current clamp is coupled to the plate and operably coupled between the sensor and the power line. Wherein the first hot line clamp, the first spacer member, the plate and the sensor cooperate in operation to measure the line to ground voltage of the power line. Wherein the current clamp and the sensor cooperate in operation to measure the current of the power line.

According to another aspect of the disclosure a system for monitoring current and voltage from a power source is provided. The system a power source configured to generate electrical power. A first power line is electrically coupled to the power source at a first end, the first power line having a first portion disposed underground and a second portion. A primary electrical distribution system is spaced apart from the ground, the primary electrical distribution system having a second power line, wherein the second portion coupled to first portion to the second power line. A sensor is electrically coupled to the second portion and configured to simultaneously measure voltage and current of the second portion. A mounting system is provided that suspends the sensor from the second power line. The mounting system comprises a first hot line clamp configured to couple with the second portion; a first spacer member having a length coupled to the first hot line clamp; a plate coupled to between the sensor and the first spacer member; and a current clamp coupled to the plate and operably coupled between the sensor and the second portion.

These and other advantages and features will become more apparent from the following description taken in conjunction with the drawings.

BRIEF DESCRIPTION OF DRAWINGS

The subject matter, which is regarded as the disclosure, is particularly pointed out and distinctly claimed in the claims at the conclusion of the specification. The foregoing and other features, and advantages of the disclosure are apparent from the following detailed description taken in conjunction with the accompanying drawings in which:

The detailed description explains embodiments of the disclosure, together with advantages and features, by way of example with reference to the drawings.

DETAILED DESCRIPTION

Embodiments of the present invention provide for a system that allows a sensor that simultaneously measures current and voltage to be suspended from a power line, such as a medium voltage electrical distribution power line for example. Embodiment of the present invention further provide for a mounting system that allows utility personnel to couple a sensor to a live or hot power line using standard utility tools, such as a shotgun stick for example, while maintaining a desired distance between the utility tool and the power line. Still further embodiments of the present invention provide for a system that allows mounting of a sensor to a primary overhead power line to measure the input current and voltage from a power source, such as a renewable energy power source.

Figure 1:
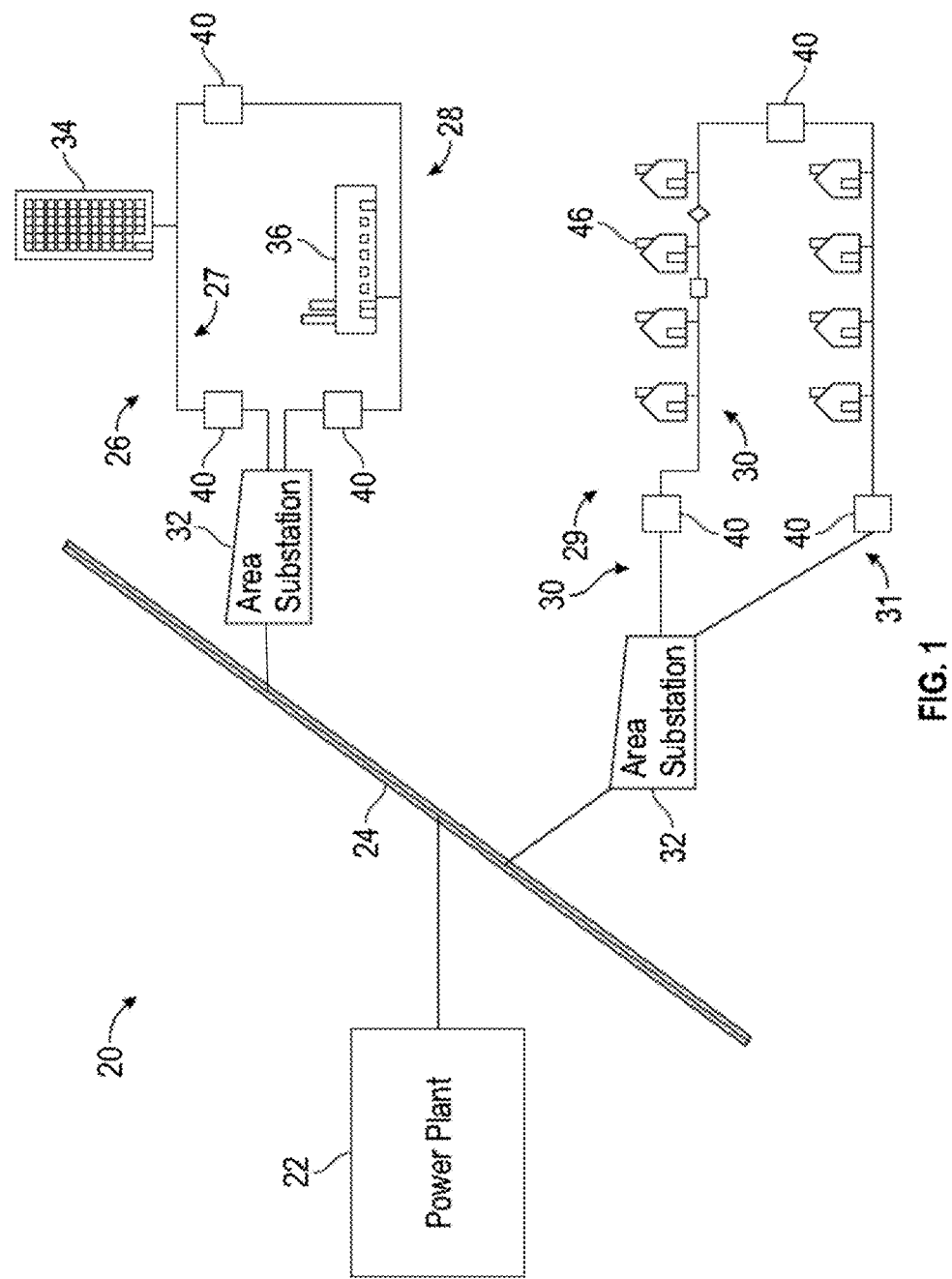
FIG. 1 is a schematic illustration of a utility electrical distribution system.

Referring now to FIG. 1, an embodiment is shown of a utility electrical distribution system 20. The utility system 20 includes one or more power sources 22 connected in parallel to a main transmission system 24. The power sources 22 may include, but are not limited to: coal, nuclear, natural gas, or incineration power plants. Additionally, the power source 22 may include one or more facilities that generate electricity based on renewable energy sources, such as but not limited to hydroelectric, solar, or wind turbine power plants. It should be appreciated that additional components such as transformers, switchgear, fuses and the like (not shown) may be incorporated into the utility system 20 as needed to ensure the efficient operation of the system. The utility system 20 is typically interconnected with one or more other utility networks to allow the transfer of electrical power into or out of the electrical system 20.

The main transmission system 24 typically consists of high transmission voltage power lines, anywhere from 69 KV to 500 KV for example, and associated transmission and distribution equipment which carry the electrical power from the point of production at the power plant 22 to the end users located on local electrical distribution systems 26, 29.

The local distribution systems 26, 29 are connected to the main distribution system by area substations 32 which reduce transmission voltage to distribution levels such as 13 KV, 27 KV or 33 KV, sometimes referred to as medium voltage power lines. Area Substations 32 typically contain one or more transformers, switching, protection, and control equipment. Area Substations 32 all include circuit breakers to interrupt faults such as short circuits or over-load currents that may occur. Substations 32 may also include equipment such as fuses, surge protection, controls, meters, capacitors, and load tap changers for voltage regulation.

The area substations 32 connect to one or more local electrical distribution systems, such as local distribution system 26, for example, that provides electrical power to a commercial area having end users such as an office building 34 or a manufacturing facility 36. In an embodiment, the area substation 32 may have two or more feeder circuits that provide electrical power to different feeder circuit branches 27, 28 of the local distribution system 26.

The residential distribution system 29 includes one or more residential buildings 46 and light industrial or commercial operations. Similar to the commercial distribution network 26, the residential system 29 is divided into multiple branch feeders 30, 31 that are fed by the substation 32. In an embodiment, the local distribution system 29 is arranged such that approximately up to 6 MVA of power is provided on each branch circuit for electrical loads such as residential buildings.

It should be appreciated that it may be desirable for the utility to monitor the voltage and current of the utility system 20 at various locations between the power source 22 and the end-user loads 34, 46. Traditionally, the measurement of electrical characteristics of the power line, such as medium voltage power lines for example, are performed by discrete sensors. For example, measurement of current is performed using a sensor having a current transformer. Since the electrical characteristics (e.g. voltage and current) are measured separately, the measurements are not performed simultaneously. Some sensors, such as the GridView Medium Voltage Sensors produced by Micatu, Inc. of Horseheads, N.Y., USA, allow for the simultaneous measurement of current and voltage. These sensors are mounted directly to the uninsulated medium voltage power line. However, these sensors are arranged in close proximity to the live or "hot" power line. Thus it is difficult for utility personnel (sometimes referred to as linemen) to install or remove the sensors using common tools utilized by utility personnel, such as a so called shotgun stick. As used herein, the term "shotgun stick" refers to a tool utilized by linemen that includes an elongated insulted body having a movable operating hook at one end. The operating hook is actuated by a sliding trigger mechanism at an opposite end of the body from the hook. The shotgun stick allows, in some circumstances, for linemen to manipulate or move electrical components that are in contact with live power lines.

Figure 2:
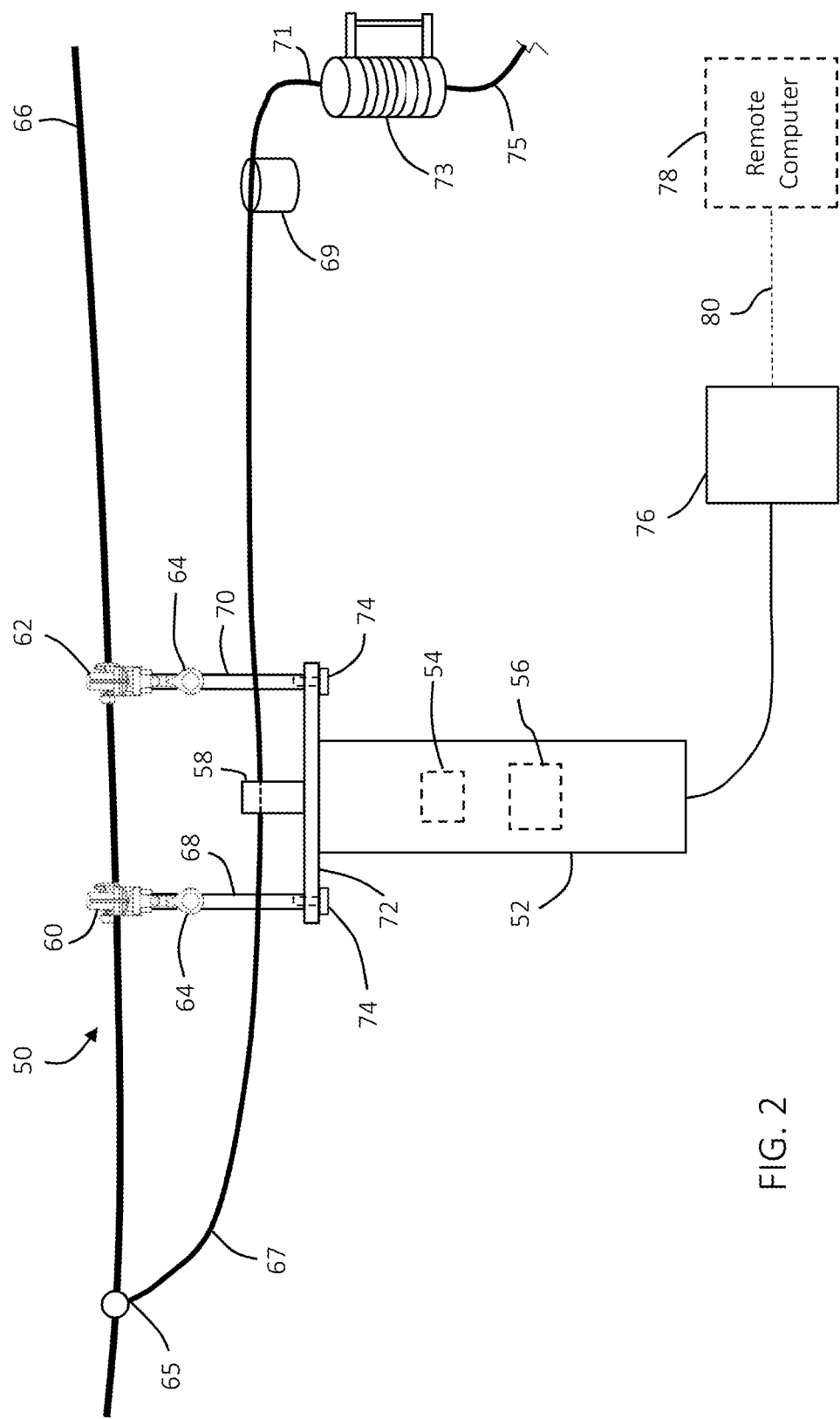
FIG. 2 is a schematic illustration of a mounting system for a sensor that measures current and voltage in a power line of the utility electrical distribution system of FIG. 1.

Referring now to FIG. 2, a mounting system 50 is provided that allows a sensor 52, such as the aforementioned GridView Medium Voltage Sensor for example, to be installed or removed from a live power line, such as a medium voltage power line having a voltage of 13 KV, 27 KV or 33 KV for example. The sensor 52 includes an insulated body having a current sensor 54 and a voltage sensor 56. The current sensor 54 is operably coupled to a current clamp 58 and is configured to measure the electrical current flowing through a wire coupled to the current clamp 58. In an embodiment, the current clamp 58 includes an iron core (e.g. a split core) in which a current is induced by the current flowing through the coupled wire.

As discussed herein, the mounting system 50 spaces the sensor 52 apart from the power line 66. In the exemplary embodiment, a tap wire 67 is coupled on an end 65 to the power line 66, such as with a stirrup clamp for example. The tap wire 67 may be coupled to the power line 66 by any known technique. The tap wire 67 is routed to pass through and coupled with the current clamp 58. In an embodiment, after exiting the current clamp 58, the tap wire is coupled to a lightning arrestor 69. The second end 71 of the tap wire 67 is coupled to the output terminal of a fused cutout 73. As will be discussed in more detail herein, the input terminal of the cutout 73 is coupled to a power source via a conductor 75 that is configured to provide generate electrical power for transmission to end users on the power line 66. It should be appreciated that the current flowing through the tap wire 67 will be the current flowing from the power source. In an embodiment, the tap wire 67 is covered with an insulating material. It should be appreciated that voltage potential between the power line 66 and the tap wire is zero or nearly zero. Therefore, in some embodiments a reduced or thin insulator material is used.

The voltage sensor 56 is operably coupled to one or more hot line clamps 60, 62 and measures the line to ground voltage as well as provides the physical suspension connection to uphold the sensor 52 in place. It should be appreciated that even though the hot line clamps 60, 62 are coupled to the primary power line 66, the measured voltage will be essentially the same as that in the tap line 67. The hot line clamps 60, 62, may be a clamping device such as a hot line tap clamp manufactured by Hubbell Power Systems, Inc. of Shelton, Conn., USA. Hot line clamps 60, 62 each include an actuator 64 that is sized to receive the operating hook from a standard shotgun stick. The hot line clamps 60, 62 typically include a slot sized to receive a conductor wire, such as power line 66. By turning the actuator 64, the hot line clamp 60, 62 is tightened onto and coupled to the power line 66. In the exemplary embodiment, the hot line clamps 60, 62 are made from aluminum, copper, or a combination thereof.

The mounting system 50 further includes spacer members 68, 70 that are directly and electrically coupled to the hot line clamps 60, 62, typically on an end of the clamps 60, 62 opposite the power line 66. In an embodiment, the spacer members 68, 70 have cylindrical body that is 8-16 inches (20-41 cm) in length. In the exemplary embodiment, the spacer members 68, 70 are 10 inches (25.4 cm) in length. It has been found that spacer members having this length allow the operation of the sensor 52 without the effects of inductive coupling, while also allowing the linemen to handle the mounting system 50 while keeping tools away power line 66. Further, spacer members of this length may be handled by the linemen without being unwieldy.

On an opposite end of the spacer members 68, 70 from the hot line clamps 60, 62, the spacer members 68, 70 are coupled to a plate 72. The plate 72 is coupled to the sensor 52 body. In an embodiment, the spacer members 68, 70 are coupled to the plate 72 by fasteners 74 that connect with a threaded hole in the end surface of the spacer members 68, 70. In an embodiment, the spacer members include a threaded hole at the hot line clamp end. A threaded stud is inserted into the threaded hole and is used to couple the hot line clamp 60, 62 to the spacer member 68, 70. In an embodiment, the spacer members 68, 70 are made from the same material as the hot line clamps 60, 62 (e.g. aluminum or copper). In an embodiment, the current clamp 58 is coupled to the sensor 52 via the plate 72.

The sensor 52 may be coupled to a controller 76. The controller 76 may include a processor that is responsive to executable computer instructions for determining a current and voltage of the power line 66 based on signals from the sensors 54, 56. The control 76 may be coupled to a remote computer 78 via a communications medium 80. The communications medium 80 may be any known or future developed communications systems, such as but not limited to WiFi (IEEE 802.11), Ethernet networks, cellular networks, satellite networks, power line communications networks, or a combination of the foregoing for example. It should be appreciated that the remote computer 78 may be located at a utility control center and allow utility personnel to monitor the operation of the electrical network 20. It should further be appreciated that the computer 78 may be a node in a distributed computing network.

Figure 3:
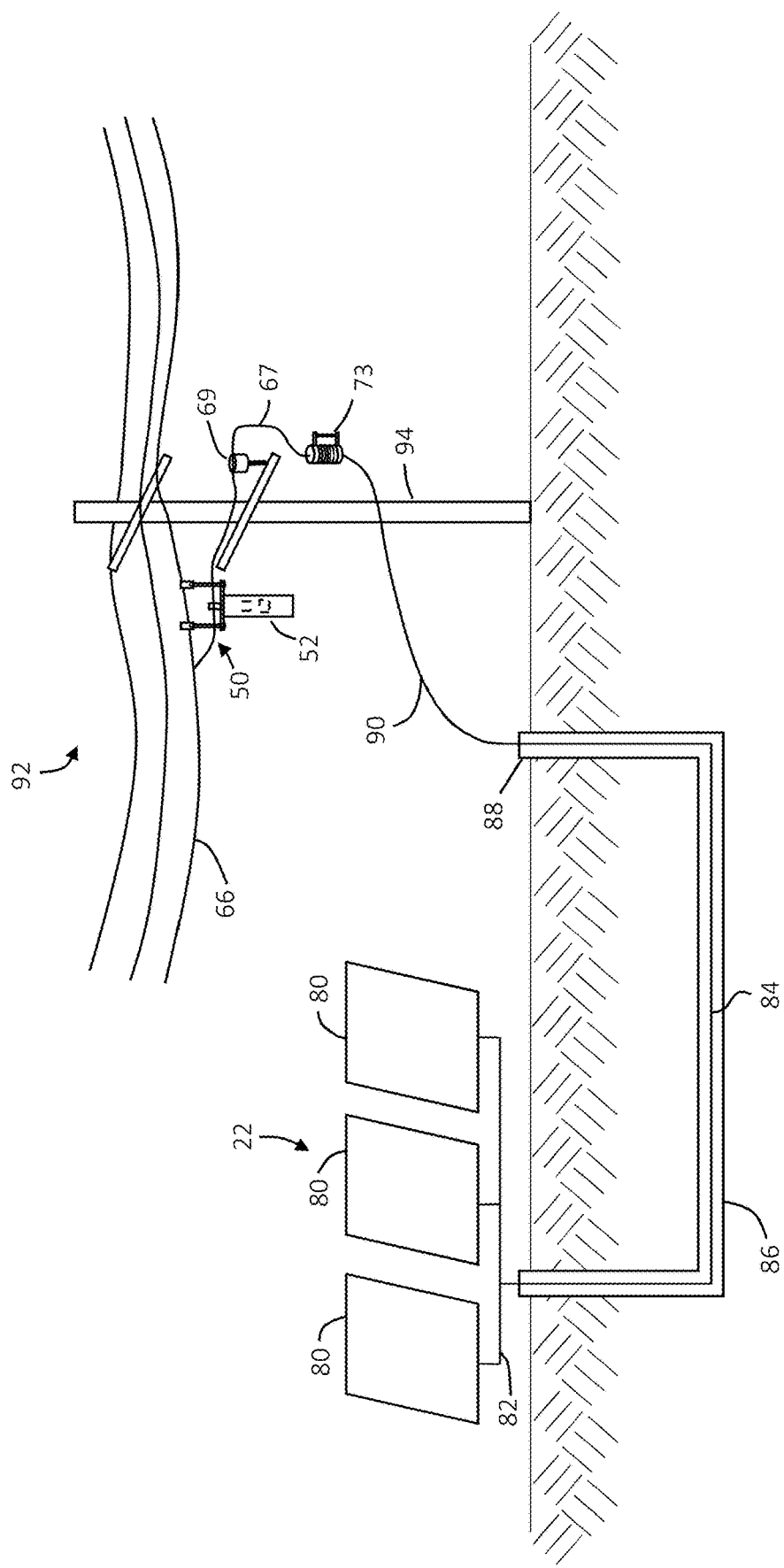
FIG. 3 is a schematic illustration of the mounting system of FIG. 2 used to measure current and voltage prior to connection to a primary electrical power lines of the utility electrical distribution system of FIG. 1.

Referring now to FIG. 3, an embodiment of a power source 22 is shown, such as a solar energy production facility. In this type of power production, multiple power sources 80 (e.g. solar panels) are connected in parallel or series. Conductors 82 carrying the power produced by the power sources 80 may have a first portion 84 that is routed underground (such as through a conduit 86) from the location of the power production to a location 88 where the conductor exits the ground and a second portion 90 of the conductor 82 is connected to an overhead power system 92. The overhead power system 92 may be referred to as a primary system and is connected to the system 20 to transfer electrical power from the power sources 22. It should be appreciated that the conductor 82 may be connected to additional electrical control equipment, such as but not limited to inverters, fuses, switchgear, capacitive banks and the like as is known in the art, but which are not shown here for the purposes of clarity. Further, while only a single conductor 82 is shown connecting to the overhead power system 92. This is for exemplary purposes and the conductor 82 may include multiple conductors that each connect to a different phase of the overhead system 92.

In an embodiment, the mounting system 50 couples the sensor 52 to the primary power line 66. A tap line 67 is coupled to the primary power line 66 adjacent the mounting system 50. The tap line 67 is coupled to the current clamp 58 as described herein. The opposite end of the tap line 67 is coupled to a lightning arrestor 69 and then the output of fused cutout 73. The input terminal of the fused cutout 73 is coupled to the second portion 90 of the conductor 82.

It should be appreciated that this arrangement allows electrical power from the power source 22 to flow from the power source 22 to the primary power line 66. Further, the arrangement of the mounting system 50 allows the measurement of current and voltage of the electrical power generated by the power source. It should be appreciated that by measuring the voltage and current of the electrical power in portion 90, the electrical power output of the power source 22 may be determined prior to be intermingled with electrical power from other power sources.

During operation, the utility can monitor the electrical characteristics of the electrical power on power line 66. In the event that undesired performance is observed, the utility can review the current and voltage of the power generated by power source 22. If the current or voltage from the power source, as measured by the sensor 52 at the point adjacent where the electrical power is injected onto the power line 66, is found to be undesirable (e.g. the voltage and current are fluctuating beyond a predetermined threshold), the power source 22 may be disconnected from the power line 66 by opening cutout 73.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the disclosure is provided in detail in connection with only a limited number of embodiments, it should be readily understood that the disclosure is not limited to such disclosed embodiments. Rather, the disclosure can be modified to incorporate any number of variations, alterations, substitutions or equivalent arrangements not heretofore described, but which are commensurate with the spirit and scope of the disclosure. Additionally, while various embodiments of the disclosure have been described, it is to be understood that the exemplary embodiment(s) may include only some of the described exemplary aspects. Accordingly, the disclosure is not to be seen as limited by the foregoing description, but is only limited by the scope of the appended claims.

What is claimed is:

1. A system for mounting a sensor to a power line, the sensor configured to simultaneously measure voltage and current, the system comprising:
    a first hot line clamp configured to couple with the power line;
    a first spacer member having a length coupled to the first hot line clamp;
    a plate coupled to the sensor and the first spacer member;
    a current clamp coupled to the plate and operably coupled between the sensor and the power line;
    a tap wire having a first end and a second end, the first end being electrically coupled to the power line, the second end being configured to couple to a power source;
    wherein the first hot line clamp, the first spacer member, the plate and the sensor cooperate in operation to measure the line to ground voltage of the power line;
    wherein the current clamp and the sensor cooperate in operation to measure the current of the power line; and
    wherein the tap wire is configured to transfer electrical power to the power line from the power source.

2. The system of claim 1, wherein the tap wire is operably coupled to the current clamp.

3. The system of claim 2, further comprising an insulating member covering the tap wire.

4. The system of claim 1, further comprising a second hot line clamp configured to couple with the power line.

5. The system of claim 4, further comprising a second spacer member coupled between the second hot line clamp and the plate.

6. The system of claim 5, wherein the wherein the first hot line clamp, second hot line clamp, the first spacer member, the second spacer member, the plate and the sensor cooperate in operation to measure the line to ground voltage of the power line.

7. The system of claim 1, wherein the first hot line clamp and the first spacer member are made from the same material.

8. The system of claim 7, wherein the material is aluminum.

9. The system of claim 1, wherein the first spacer member has a length between 8 inches to 16 inches.

10. The system of claim 9, wherein the first spacer member has a length of 10 inches.

* * * * *